(12) United States Patent
Gaudiana et al.

(10) Patent No.: US 7,749,794 B2
(45) Date of Patent: Jul. 6, 2010

(54) METHOD OF PREPARING ELECTRODE

(75) Inventors: Russell Gaudiana, Merrimack, NH (US); Alan Montello, West Newbury, MA (US); Edmund Montello, Rockport, MA (US)

(73) Assignees: Konarka Technologies, Inc., Lowell, MA (US); Leonhard Kurz GmbH & Co. KG, Fuerth (DE)

( * ) Notice: Subject to any disclaimer, the term of this patent is extended or adjusted under 35 U.S.C. 154(b) by 348 days.

(21) Appl. No.: 11/473,467

(22) Filed: Jun. 23, 2006

(65) Prior Publication Data

US 2007/0037302 A1 Feb. 15, 2007

Related U.S. Application Data

(60) Provisional application No. 60/693,829, filed on Jun. 24, 2005.

(51) Int. Cl.
*H01L 21/00* (2006.01)

(52) U.S. Cl. .................. 438/57; 257/E25.009; 156/259

(58) Field of Classification Search .................. 438/57, 438/61, 98; 156/256; 257/E25.009
See application file for complete search history.

(56) References Cited

U.S. PATENT DOCUMENTS

| | | | |
|---|---|---|---|
| 4,231,808 A | | 11/1980 | Tabei et al. |
| 4,318,938 A | * | 3/1982 | Barnett et al. .................. 438/62 |
| 5,871,630 A | | 2/1999 | Bhattacharya et al. |
| 5,942,048 A | | 8/1999 | Fujisaki et al. |
| 6,190,937 B1 | | 2/2001 | Nakagawa et al. |
| 6,258,620 B1 | | 7/2001 | Morel et al. |
| 6,294,401 B1 | | 9/2001 | Jacobson et al. |
| 6,429,369 B1 | | 8/2002 | Tober et al. |
| 6,531,704 B2 | | 3/2003 | Yadav et al. |
| 6,534,704 B2 | | 3/2003 | Hashimoto et al. |
| 6,825,409 B2 | | 11/2004 | Haussler et al. |
| 6,891,191 B2 | | 5/2005 | Xiao et al. |
| 6,900,382 B2 | | 5/2005 | Chittibabu et al. |
| 2003/0054663 A1 | | 3/2003 | Stanbery |
| 2003/0230337 A1 | * | 12/2003 | Gaudiana et al. ............ 136/256 |
| 2004/0025933 A1 | | 2/2004 | Chittibabu et al. |
| 2004/0187911 A1 | * | 9/2004 | Gaudiana et al. ............ 136/252 |
| 2004/0187917 A1 | * | 9/2004 | Pichler ....................... 136/263 |
| 2004/0216778 A1 | | 11/2004 | Ferri et al. |
| 2005/0106855 A1 | * | 5/2005 | Farnworth ................... 438/622 |

FOREIGN PATENT DOCUMENTS

| | | |
|---|---|---|
| CN | 1150338 A | 5/1997 |
| CN | 1192055 A | 9/1998 |
| EP | 0684652 | 11/1995 |
| WO | WO 92/14270 | 8/1992 |

OTHER PUBLICATIONS

U.S. Appl. No. 11/487,276, filed Jul. 2006, Berke et al.*
Dictionary.com, "article," in The American Heritage® Dictionary of the English Language, Fourth Edition. Source location: Houghton Mifflin Company, 2004. http://dictionary.reference.com/browse/article. Available: http://dictionary.reference.com. Accessed: Dec. 17, 2009.*

* cited by examiner

*Primary Examiner*—Alexander G Ghyka
*Assistant Examiner*—Leonard Chang
(74) *Attorney, Agent, or Firm*—Fish & Richardson P.C.

(57) ABSTRACT

Methods of preparing electrodes, as well as related devices, components, systems, and methods, are disclosed.

46 Claims, 7 Drawing Sheets

METHOD OF PREPARING ELECTRODE

CROSS REFERENCE TO RELATED APPLICATION

This application claims priority to U.S. Provisional Application Ser. No. 60/693,829, filed Jun. 24, 2005, the contents of which are hereby incorporated by reference.

TECHNICAL FIELD

This disclosure relates to methods of preparing electrodes, as well as related devices, components, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material may have a lower electrical conductivity than electrically conductive materials, the semiconductive material can transmit more light than many electrically conductive materials.

SUMMARY

In one aspect, the invention features a method that includes contacting a die with a first layer, which supports a metal layer, so that at least a portion of the metal layer is transferred to a second layer to form a photovoltaic cell electrode.

In another aspect, the invention features a method that includes forming an electrode of a photovoltaic cell using stamping.

In still another aspect, the invention features a method that includes forming an electrode of a multilayer device using stamping.

Embodiments can include one or more of the following aspects.

The method can further include heating the die to at least about 100° C. (e.g., at least about 150° C., at least about 200° C., at least about 250° C., or at least about 300° C.).

The contact step can include applying a pressure of at least about 100 psi (e.g., at least about 1,000 psi or at least about 5,000 psi) to the die.

The method can further include disposing a release layer between the metal layer and the first layer. In some embodiments, the release layer includes a material selected from the group consisting of polyesters (e.g., aliphatic polyesters) or polyethylenes (e.g., low molecular weight polyethylenes).

The metal layer can include aluminum, iron, gold, silver, copper, nickel, palladium, platinum, titanium, or an alloy thereof.

The electrode can be a mesh electrode.

The mesh electrode can include a plurality of open regions, at least some of the open regions have a rectangular, square, circular, semicircular, triangular, diamond, ellipse, trapezoid, or irregular shape. In some embodiments, at least some of the open regions have a waved, sloped, arched, pointed, striped, or checkered shape.

The second layer can be a substrate of a photovoltaic cell. In some embodiments, the method can further include applying a photoactive material to the substrate. In some embodiments, the photoactive material can include an electron donor material and an electron acceptor material. In other embodiments, the photoactive material can include a photosensitized interconnected nanoparticle material.

The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

The electron donor material can include a material selected from the group consisting of discotic liquid crystals, polythiophenes, polyphenylenes, polyphenylvinylenes, polysilanes, polythienylvinylenes, polyisothianaphthalenes, and combinations thereof.

The photosensitized interconnected nanoparticle material can include a material selected from the group consisting of selenides, sulfides, tellurides, titanium oxides, tungsten oxides, zinc oxides, zirconium oxides, and combinations thereof.

The die can include a surface having a mesh pattern. In some embodiments, at least a portion of the surface is planar or curved. The die can be attached a rotary tooling or a fix tooling.

The first or second layer can include a flexible substrate. In some embodiments, the first or second layer can include a polymer selected from the group consisting of polyethylene terephthalates, polyimides, polyethylene naphthalates, polymeric hydrocarbons, cellulosic polymers, polycarbonates, polyamides, polyethers, polyether ketones, and combinations thereof.

The multilayer device can include a liquid crystal display, a light emitting diode, or a photovoltaic module. The liquid crystal display can be backlit or reflective.

Embodiments can provide one or more of the following advantages.

The electrode can be highly conductive and/or highly transparent.

The method can be used in any suitable light emitting or absorbing device in which one surface of the device needs to be conductive and transparent.

The method can be used in a continuous process, such as a roll-to-roll process.

Other features and advantages will be apparent from the description, drawings and from the claims.

DESCRIPTION OF DRAWINGS

Like reference symbols in the various drawings indicate like elements.

DETAILED DESCRIPTION

In general, this disclosure relates to methods of preparing electrodes.

In some embodiments, a mesh electrode can be stamped on a layer by the following method. A die (e.g., a hot stamping die) having a pattern (e.g., a mesh pattern) machined into its surface can be brought into contact with the back surface of a first layer (e.g., a flexible substrate). The front surface of the first layer can be coated with a continuous metal layer. The front surface of the first layer can then be brought into contact with a second layer, which serves as a receiving layer. When a pressure is applied to the die, the metal layer on the front surface of the first layer transfers and adheres to the second layer. The pressure applied to the die can be at least about 100 psi (e.g., at least about 1,000 psi or at least about 5,000 psi). In some embodiments, the front surface of the first layer can be brought into contact with the second layer before the die contacts the back surface of the first layer.

In some embodiments, the die can be heated to a suitable temperature (e.g., at least about 100° C., at least about 150° C., at least about 200° C., at least about 250° C., or at least about 300° C.) to facilitate transfer of the metal layer from the front surface of the first layer to the second layer.

In some embodiments, a release layer can be included between the metal layer and the first layer to aid release of the metal layer. The release layer can include a material that liquefies below the temperature of the die during the stamping process. Examples of such materials include wax or a polymer with a low melting point (e.g., aliphatic polyesters or low molecular weight polyethylenes).

In some embodiments, the methods described above can be used to prepare electrodes of a multilayer device, such as a liquid crystal display, a light emitting diode, or a photovoltaic module. The photovoltaic module can include one or more photovoltaic cells, such as organic photovoltaic cells, dye sensitized solar cells (DSSCs), and/or tandem cells.

Figure 1A:
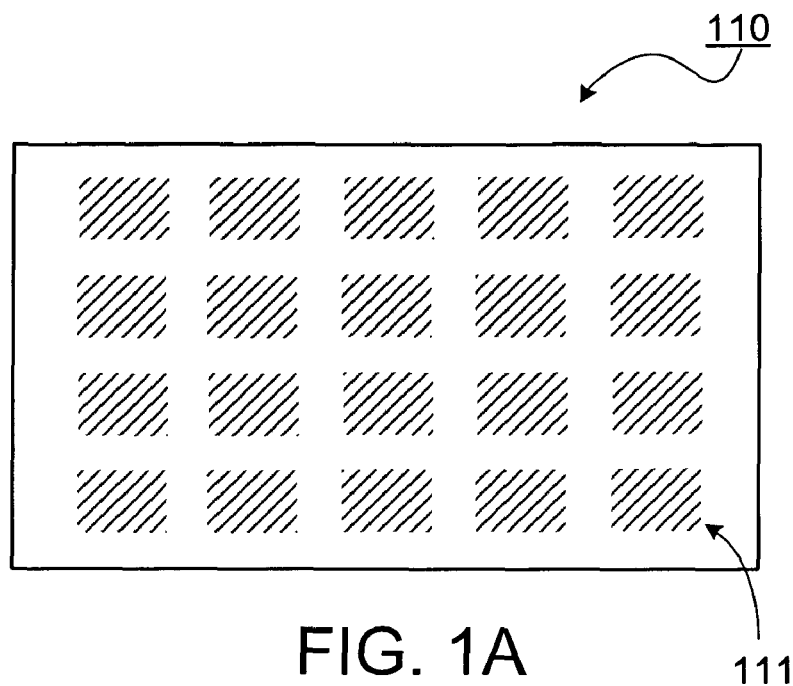
FIG. 1(a) is a top view of a substrate having a plurality of regions coated with a photoactive material.
Figure 1B:
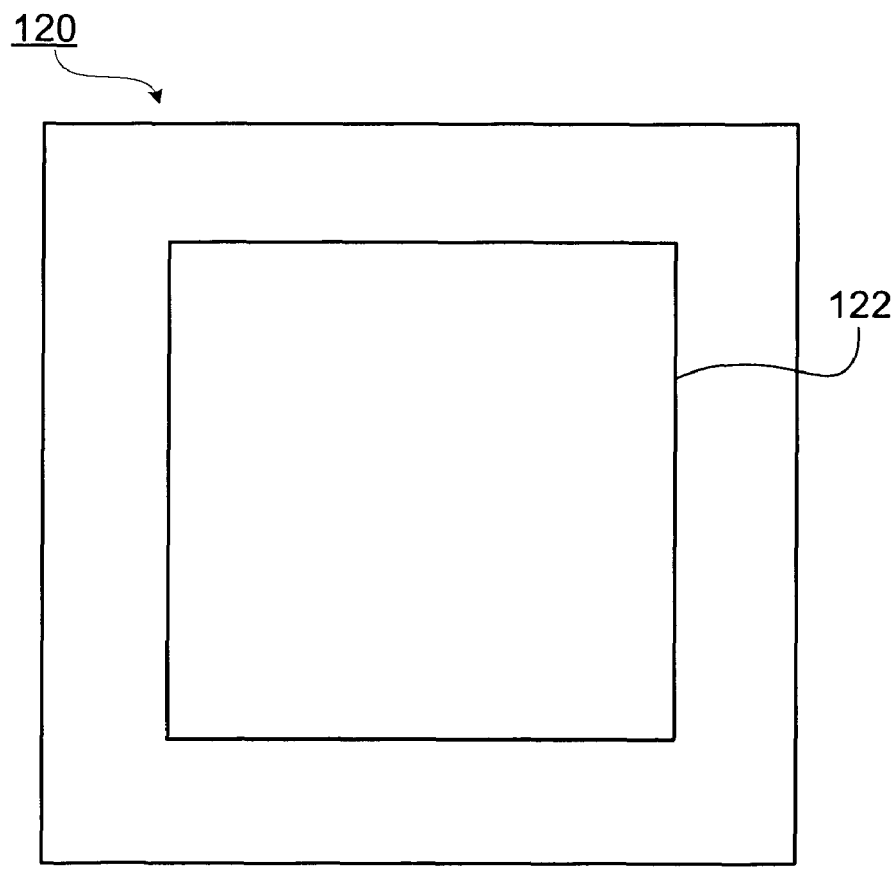
FIG. 1(b) is a front surface view of a substrate coated with a metal layer.
Figure 1C:
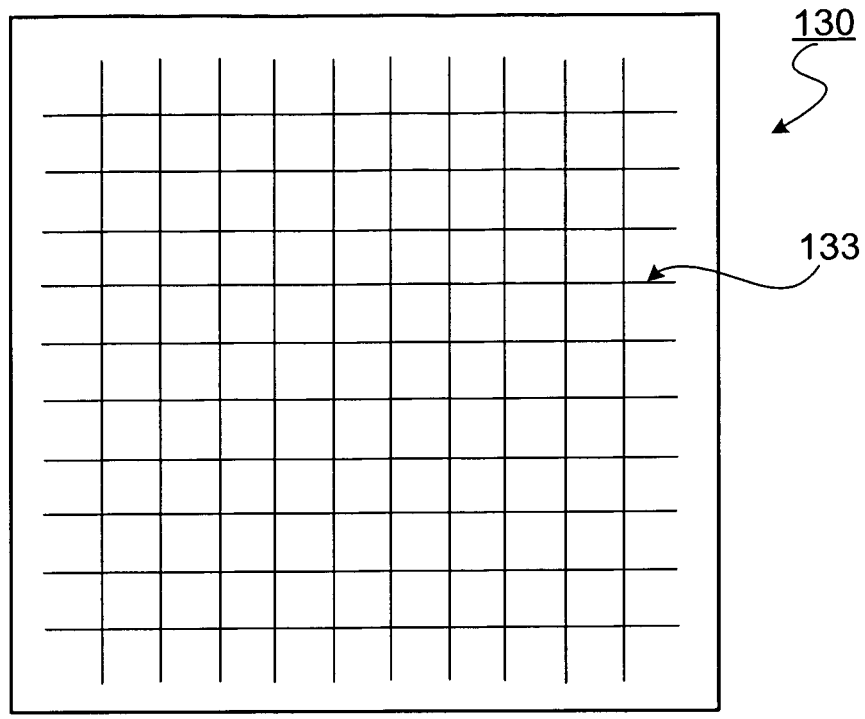
FIG. 1(c) is a top view of a die having a mesh pattern on a surface.
Figure 1D:
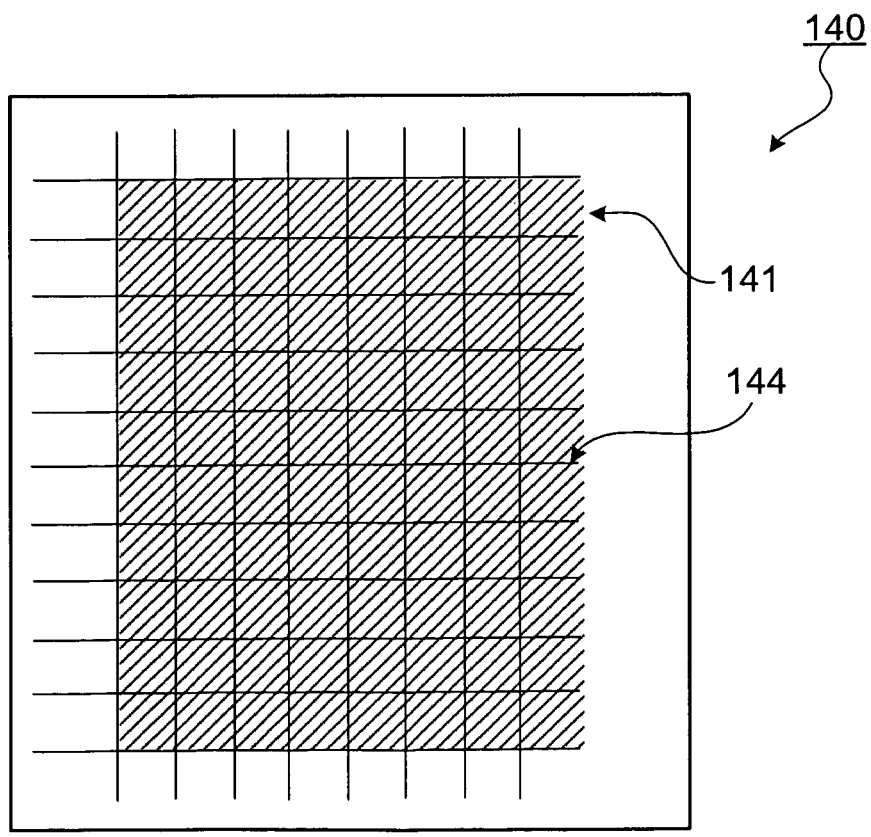
FIG. 1(d) is a top view of a substrate of FIG. 1(a) with a mesh electrode formed thereon.

In some embodiments, the methods described above can be used to prepare electrodes of a photovoltaic cell. For example, FIG. 1(a) shows a top view of a receiving substrate 110 containing a plurality of regions 111 coated with a photoactive material. Receiving substrate 110 can be used as a substrate in a photovoltaic cell. FIG. 1(b) shows a front surface view of a transfer substrate 120 coated with a metal layer 122. FIG. 1(c) is a top view of a die 130 having a mesh pattern 133 on a surface. During the stamping process, die 130 can be brought into contact with the back surface of transfer substrate 120 and the front surface of the transfer substrate 120 can be brought into contact with receiving substrate 110. When a pressure is applied to the die, metal layer 122 on transfer substrate 120 transfers and adheres to the receiving substrate 110. FIG. 1(d) shows a top view of a substrate 140 with a mesh electrode 144. As shown in FIG. 1(d), mesh electrode 144 is formed on substrate 140 such that the photoactive material are located in the open regions of mesh electrode 144.

Figure 2:
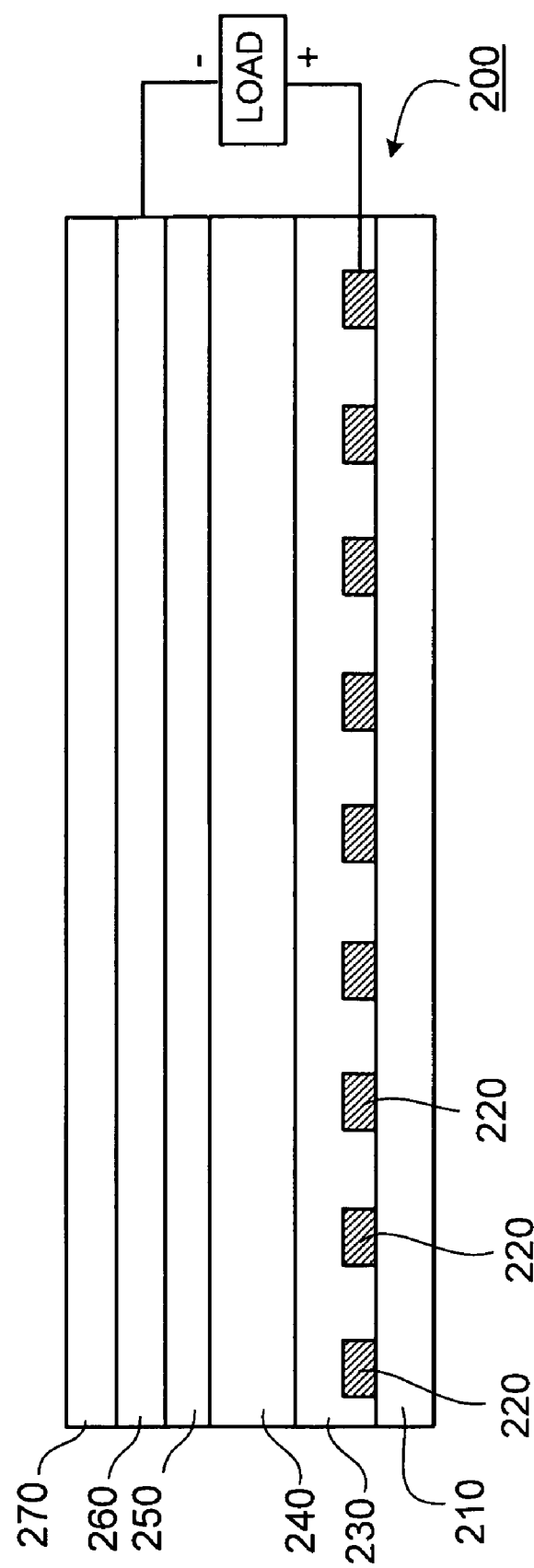
FIG. 2 is a cross-sectional view of an organic photovoltaic cell

In some embodiments, the methods described above can be used to print an electrode on a substrate for use in an organic photovoltaic cell. FIG. 2 shows a cross-sectional view of an organic photovoltaic cell 200 that includes a transparent substrate 210, a mesh cathode 220, a hole carrier layer 230, a photoactive layer (containing an electron acceptor material and an electron donor material) 240, a hole blocking layer 250, an anode 260, and a substrate 270.

Figure 3:
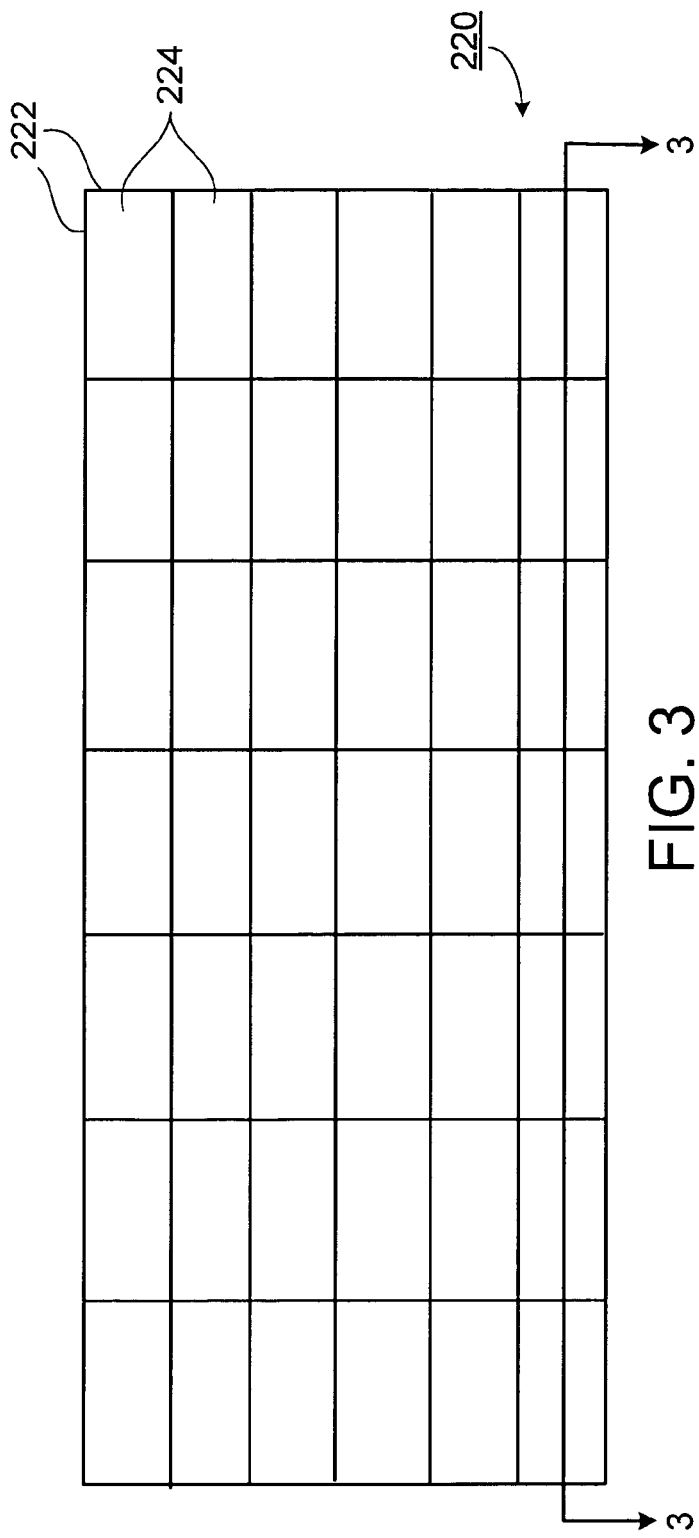
FIG. 3 is an elevational view of an embodiment of a mesh electrode.
Figure 4:
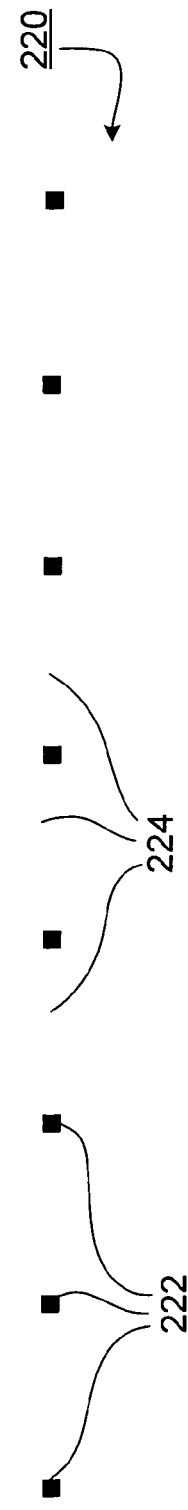
FIG. 4 is a cross-sectional view of the mesh electrode of FIG. 3.

FIGS. 3 and 4 respectively show an elevational view and a cross-sectional of a mesh electrode. As shown in FIGS. 3 and 4, mesh cathode 220 includes solid regions 222 and open regions 224. In general, regions 222 are formed of electrically conducting material so that mesh cathode 220 can allow light to pass therethrough via regions 224 and conduct electrons via regions 222.

As shown in FIGS. 3 and 4, mesh cathode 220 includes solid regions 222 and open regions 224. In general, regions 222 are formed of electrically conducting material so that mesh cathode 220 can allow light to pass therethrough via regions 224 and conduct electrons via regions 222.

The area of mesh cathode 220 occupied by open regions 224 (the open area of mesh cathode 220) can be selected as desired. Generally, the open area of mesh cathode 220 is at least about 10% (e.g., at least about 20%, at least about 30%, at least about 40%, at least about 50%, at least about 60%, at least about 70%, at least about 80%) and/or at most about 99% (e.g., at most about 95%, at most about 90%, at most about 85%) of the total area of mesh cathode 220.

Mesh cathode 220 can be prepared in various ways. In some embodiments, mesh electrode can be stamped onto a layer (e.g., a substrate) as described above. In some embodiments, mesh cathode 220 is a woven mesh formed by weaving wires of material that form solid regions 222. The wires can be woven using, for example, a plain weave, a Dutch, weave, a twill weave, a Dutch twill weave, or combinations thereof. In certain embodiments, mesh cathode 220 is formed of a welded wire mesh. In some embodiments, mesh cathode 220 is an expanded mesh formed. An expanded metal mesh can be prepared, for example, by removing regions 224 (e.g., via laser removal, via chemical etching, via puncturing) from a sheet of material (e.g., an electrically conductive material, such as a metal), followed by stretching the sheet (e.g., stretching the sheet in two dimensions). In certain embodiments, mesh cathode 220 is a metal sheet formed by removing regions 224 (e.g., via laser removal, via chemical etching, via puncturing) without subsequently stretching the sheet.

In certain embodiments, solid regions 222 are formed entirely of an electrically conductive material (e.g., regions 222 are formed of a substantially homogeneous material that is electrically conductive). Examples of electrically conductive materials that can be used in regions 222 include electrically conductive metals, electrically conductive alloys and electrically conductive polymers. Exemplary electrically conductive metals include gold, silver, copper, aluminum, nickel, palladium, platinum and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., poly(3,4-ethelynedioxythiophene) (PEDOT)), polyanilines (e.g., doped polyanilines), polypyrroles (e.g., doped polypyrroles). In some embodiments, combinations of electrically conductive materials are used. In some embodiments, solid regions 222 can have a resistivity less than about 3 ohm per square.

Figure 5:
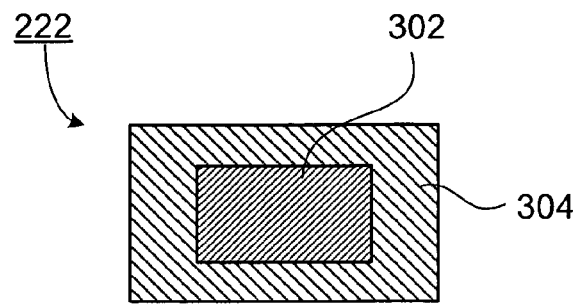
FIG. 5 is a cross-sectional view of a portion of a mesh electrode.

As shown in FIG. 5, in some embodiments, solid regions 222 are formed of a material 302 that is coated with a different material 304 (e.g., using metallization, using vapor deposition). In general, material 302 can be formed of any desired material (e.g., an electrically insulative material, an electrically conductive material, or a semiconductive material), and material 304 is an electrically conductive material. Examples of electrically insulative material from which material 302 can be formed include textiles, optical fiber materials, polymeric materials (e.g., a nylon) and natural materials (e.g., flax, cotton, wool, silk). Examples of electrically conductive materials from which material 302 can be formed include the electrically conductive materials disclosed above. Examples of semiconductive materials from which material 302 can be formed include indium tin oxide, fluorinated tin oxide, tin oxide, and zinc oxide. In some embodiments, material 302 is in the form of a fiber, and material 304 is an electrically conductive material that is coated on material 302. In certain embodiments, material 302 is in the form of a mesh (see discussion above) that, after being formed into a mesh, is coated with material 304. As an example, material 302 can be an expanded metal mesh, and material 304 can be PEDOT that is coated on the expanded metal mesh.

Generally, the maximum thickness of mesh cathode 220 (i.e., the maximum thickness of mesh cathode 220 in a direction substantially perpendicular to the surface of substrate 210 in contact with mesh cathode 220) should be less than the total thickness of hole carrier layer 230. Typically, the maximum thickness of mesh cathode 220 is at least 0.1 micron (e.g., at least about 0.2 micron, at least about 0.3 micron, at least about 0.4 micron, at least about 0.5 micron, at least about 0.6 micron, at least about 0.7 micron, at least about 0.8 micron, at least about 0.9 micron, at least about one micron) and/or at most about 10 microns (e.g., at most about nine microns, at most about eight microns, at most about seven microns, at most about six microns, at most about five microns, at most about four microns, at most about three microns, at most about two microns).

While shown in FIG. 3 as having a rectangular shape, open regions 224 can generally have any desired shape (e.g., square, circle, semicircle, triangle, diamond, ellipse, trapezoid, irregular shape). In some embodiments, different open regions 224 in mesh cathode 220 can have different shapes.

Although shown in FIG. 4 as having square cross-sectional shape, solid regions 222 can generally have any desired shape (e.g., rectangle, circle, semicircle, triangle, diamond, ellipse, trapezoid, irregular shape). In some embodiments, different solid regions 222 in mesh cathode 220 can have different shapes. In embodiments where solid regions 222 have a circular cross-section, the cross-section can have a diameter in the range of about 5 microns to about 200 microns. In embodiments where solid regions 222 have a trapezoid cross-section, the cross-section can have a height in the range of about 0.1 micron to about 5 microns and a width in the range of about 5 microns to about 200 microns.

In some embodiments, mesh cathode 220 is flexible (e.g., sufficiently flexible to be incorporated in photovoltaic cell 200 using a continuous, roll-to-roll manufacturing process). In certain embodiments, mesh cathode 220 is semi-rigid or inflexible. In some embodiments, different regions of mesh cathode 220 can be flexible, semi-rigid or inflexible (e.g., one or more regions flexible and one or more different regions semi-rigid, one or more regions flexible and one or more different regions inflexible).

In general, mesh electrode 220 can be disposed on substrate 210. In some embodiments, mesh electrode 220 can be partially embedded in substrate 210.

Substrate 210 is generally formed of a transparent material. As referred to herein, a transparent material is a material which, at the thickness used in a photovoltaic cell 200, transmits at least about 60% (e.g., at least about 70%, at least about 75%, at least about 80%, at least about 85%, at least about 90%, at least about 95%) of incident light at a wavelength or a range of wavelengths used during operation of the photovoltaic cell. Exemplary materials from which substrate 210 can be formed include polyethylene terephthalates, polyimides, polyethylene naphthalates, polymeric hydrocarbons, cellulosic polymers, polycarbonates, polyamides, polyethers, polyether ketones, and combinations thereof. In certain embodiments, the polymer can be a fluorinated polymer. In some embodiments, combinations of polymeric materials are used. In certain embodiments, different regions of substrate 210 can be formed of different materials.

In general, substrate 210 can be flexible, semi-rigid or rigid (e.g., glass). In some embodiments, substrate 210 has a flexural modulus of less than about 5,000 megaPascals. In certain embodiments, different regions of substrate 210 can be flexible, semi-rigid or inflexible (e.g., one or more regions flexible and one or more different regions semi-rigid, one or more regions flexible and one or more different regions inflexible).

Typically, substrate 210 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, substrate 210 can be colored or non-colored. In some embodiments, one or more portions of substrate 210 is/are colored while one or more different portions of substrate 210 is/are non-colored.

Substrate 210 can have one planar surface (e.g., the surface on which light impinges), two planar surfaces (e.g., the surface on which light impinges and the opposite surface), or no planar surfaces. A non-planar surface of substrate 210 can, for example, be curved or stepped. In some embodiments, a non-planar surface of substrate 210 is patterned (e.g., having patterned steps to form a Fresnel lens, a lenticular lens or a lenticular prism).

Hole carrier layer 230 is generally formed of a material that, at the thickness used in photovoltaic cell 200, transports holes to mesh cathode 220 and substantially blocks the transport of electrons to mesh cathode 220. Examples of materials from which layer 230 can be formed include polythiophenes (e.g., PEDOT), polyanilines, polyvinylcarbazoles, polyphenylenes, polyphenylvinylenes, polysilanes, polythienylenevinylenes and/or polyisothianaphthanenes. In some embodiments, hole carrier layer 230 can include combinations of hole carrier materials.

In general, the distance between the upper surface of hole carrier layer 230 (i.e., the surface of hole carrier layer 230 in contact with active layer 240) and the upper surface of substrate 210 (i.e., the surface of substrate 210 in contact with mesh electrode 220) can be varied as desired. Typically, the distance between the upper surface of hole carrier layer 230 and the upper surface of mesh cathode 220 is at least 0.01 micron (e.g., at least about 0.05 micron, at least about 0.1 micron, at least about 0.2 micron, at least about 0.3 micron, at least about 0.5 micron) and/or at most about five microns (e.g., at most about three microns, at most about two microns, at most about one micron). In some embodiments, the distance between the upper surface of hole carrier layer 230 and the upper surface of mesh cathode 220 is from about 0.01 micron to about 0.5 micron.

Active layer 240 generally contains an electron acceptor material and an electron donor material.

Examples of electron acceptor materials include formed of fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., C61-phenyl-butyric acid methyl ester; PCBM). In some embodiments, active layer 240 can include a combination of electron acceptor materials.

Examples of electron donor materials include discotic liquid crystals, polythiophenes, polyphenylenes, polyphenylvinylenes, polysilanes, polythienylvinylenes, polyisothianaphthalenes, and combinations thereof. In some embodiments, the electron donor material is poly(3-hexylthiophene). In certain embodiments, active layer 240 can include a combination of electron donor materials.

Generally, active layer 240 is sufficiently thick to be relatively efficient at absorbing photons impinging thereon to form corresponding electrons and holes, and sufficiently thin to be relatively efficient at transporting the holes and electrons to layers 230 and 250, respectively. In certain embodiments, layer 240 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, layer 140 is from about 0.1 micron to about 0.2 micron thick.

Hole blocking layer 250 is generally formed of a material that, at the thickness used in photovoltaic cell 200, transports electrons to anode 260 and substantially blocks the transport of holes to anode 260. Examples of materials from which layer 250 can be formed include LiF and metal oxides (e.g., zinc oxide, titanium oxide).

Typically, hole blocking layer 250 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

Anode 260 is generally formed of an electrically conductive material, such as one or more of the electrically conductive materials noted above. In some embodiments, anode 260 is formed of a combination of electrically conductive materials.

In general, substrate 270 can be identical to substrate 220. In some embodiments, substrate 270 can be different from substrate 220 (e.g., having a different shape or formed of a different material or a non-transparent material).

Figure 6:
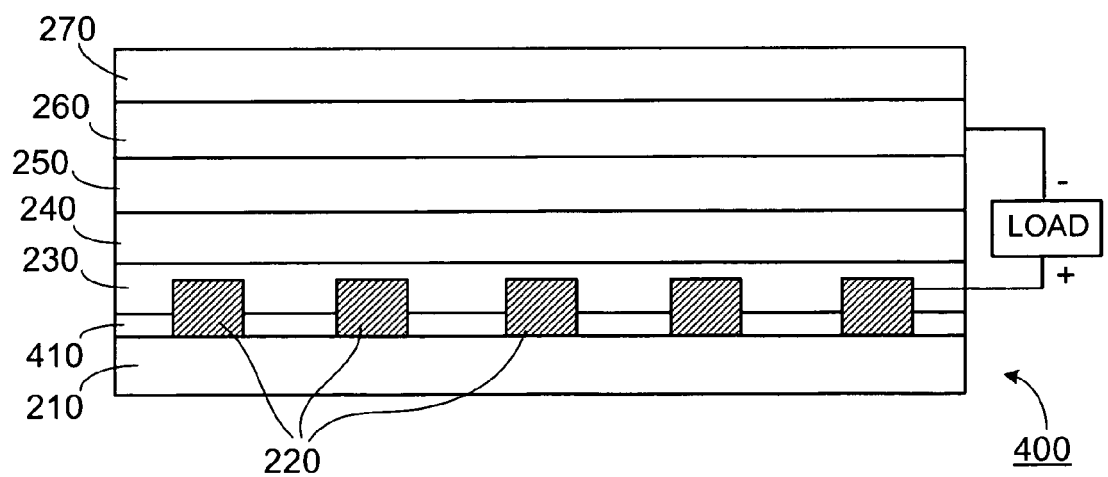
FIG. 6 is a cross-sectional view of another organic photovoltaic cell.

FIG. 6 shows a cross-sectional view of a photovoltaic cell 400 that includes an adhesive layer 410 between substrate 210 and hole carrier layer 230.

Generally, any material capable of holding mesh cathode 230 in place can be used in adhesive layer 410. In general, adhesive layer 410 is formed of a material that is transparent at the thickness used in photovoltaic cell 400. Examples of adhesives include epoxies and urethanes. Examples of commercially available materials that can be used in adhesive layer 410 include Bynel™ adhesive (DuPont) and 615 adhesive (3M). In some embodiments, layer 410 can include a fluorinated adhesive. In certain embodiments, layer 410 contains an electrically conductive adhesive. An electrically conductive adhesive can be formed of, for example, an inherently electrically conductive polymer, such as the electrically conductive polymers disclosed above (e.g., PEDOT). An electrically conductive adhesive can be also formed of a polymer (e.g., a polymer that is not inherently electrically conductive) that contains one or more electrically conductive materials (e.g., electrically conductive particles). In some embodiments, layer 410 contains an inherently electrically conductive polymer that contains one or more electrically conductive materials.

In some embodiments, the thickness of layer 410 (i.e., the thickness of layer 410 in a direction substantially perpendicular to the surface of substrate 210 in contact with layer 410) is less thick than the maximum thickness of mesh cathode 220. In some embodiments, the thickness of layer 410 is at most about 90% (e.g., at most about 80%, at most about 70%, at most about 60%, at most about 50%, at most about 40%, at most about 30%, at most about 20%) of the maximum thickness of mesh cathode 220. In certain embodiments, however, the thickness of layer 410 is about the same as, or greater than, the maximum thickness of mesh cathode 220.

In general, a photovoltaic cell having a mesh cathode can be manufactured as desired.

In some embodiments, a photovoltaic cell can be prepared as follows. Electrode 260 is formed on substrate 270 using conventional techniques, and hole-blocking layer 250 is formed on electrode 260 (e.g., using a vacuum deposition process or a solution coating process). Active layer 240 is formed on hole-blocking layer 250 (e.g., using a solution coating process, such as slot coating, spin coating or gravure coating). Hole carrier layer 230 is formed on active layer 240 (e.g., using a solution coating process, such as slot coating, spin coating or gravure coating). Mesh cathode 220 is partially disposed in hole carrier layer 230 (e.g., by a stamping method described above). Substrate 210 is then formed on mesh cathode 220 and hole carrier layer 230 using conventional methods.

In certain embodiments, a photovoltaic cell can be prepared as follows. Electrode 260 is formed on substrate 270 using conventional techniques, and hole-blocking layer 250 is formed on electrode 260 (e.g., using a vacuum deposition or a solution coating process). Active layer 240 is formed on hole-blocking layer 250 (e.g., using a solution coating process, such as slot coating, spin coating or gravure coating). Hole carrier layer 230 is formed on active layer 240 (e.g., using a solution coating process, such as slot coating, spin coating or gravure coating). Adhesive layer 410 is disposed on hole carrier layer 230 using conventional methods. Mesh cathode 220 is partially disposed in adhesive layer 410 and hole carrier layer 230 (e.g., by disposing mesh cathode 220 on the surface of adhesive layer 410, and pressing mesh cathode 220). Substrate 210 is then formed on mesh cathode 220 and adhesive layer 410 using conventional methods.

While the foregoing processes involve partially disposing mesh cathode 220 in hole carrier layer 230, in some embodiments, mesh cathode 220 is formed by printing the cathode material on the surface of hole carrier layer 230 or adhesive layer 410 to provide an electrode having the open structure shown in the figures. For example, mesh cathode 220 can be printed using stamping, dip coating, extrusion coating, spray coating, inkjet printing, screen printing, and gravure printing. The cathode material can be disposed in a paste which solidifies upon heating or radiation (e.g., UV radiation, visible radiation, IR radiation, electron beam radiation). The cathode material can be, for example, vacuum deposited in a mesh pattern through a screen or after deposition it may be patterned by photolithography.

Figure 7:
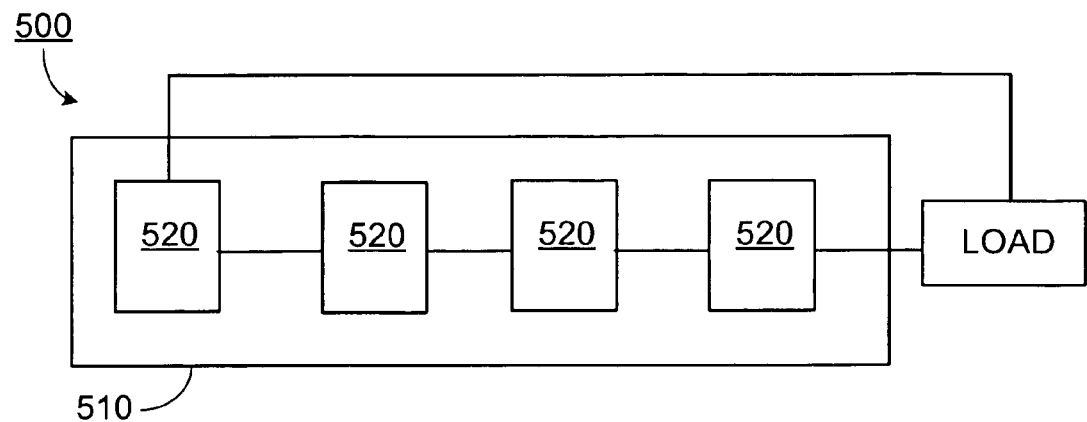
FIG. 7 is a schematic of a system containing multiple photovoltaic cells electrically connected in series.
Figure 8:
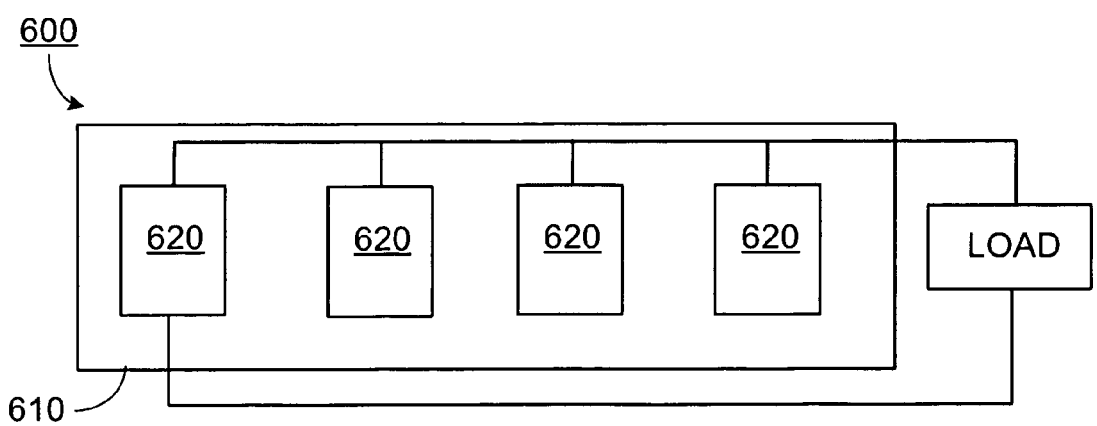
FIG. 8 is a schematic of a system containing multiple photovoltaic cells electrically connected in parallel.

Multiple photovoltaic cells can be electrically connected to form a photovoltaic system. As an example, FIG. 7 is a schematic of a photovoltaic system 500 having a module 510 containing photovoltaic cells 520. Cells 520 are electrically connected in series, and system 500 is electrically connected to a load. As another example, FIG. 8 is a schematic of a photovoltaic system 600 having a module 610 that contains photovoltaic cells 620. Cells 620 are electrically connected in parallel, and system 600 is electrically connected to a load. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

In some embodiments, photovoltaic systems containing a plurality of photovoltaic cells can be fabricated using continuous manufacturing processes, such as roll-to-roll or web processes. In some embodiments, a continuous manufacturing process includes: forming a group of photovoltaic cell portions on a first advancing substrate; disposing an electrically insulative material between at least two of the cell portions on the first substrate; embedding a wire in the electrically insulative material between at least two photovoltaic cell portions on the first substrate; forming a group of photovoltaic cell portion on a second advancing substrate; combining the first and second substrates and photovoltaic cell portions to form a plurality of photovoltaic cells, in which at least two photovoltaic cells are electrically connected in series by the wire. In some embodiments, the first and second substrates can be continuously advanced, periodically advanced, or irregularly advanced.

Figure 9:
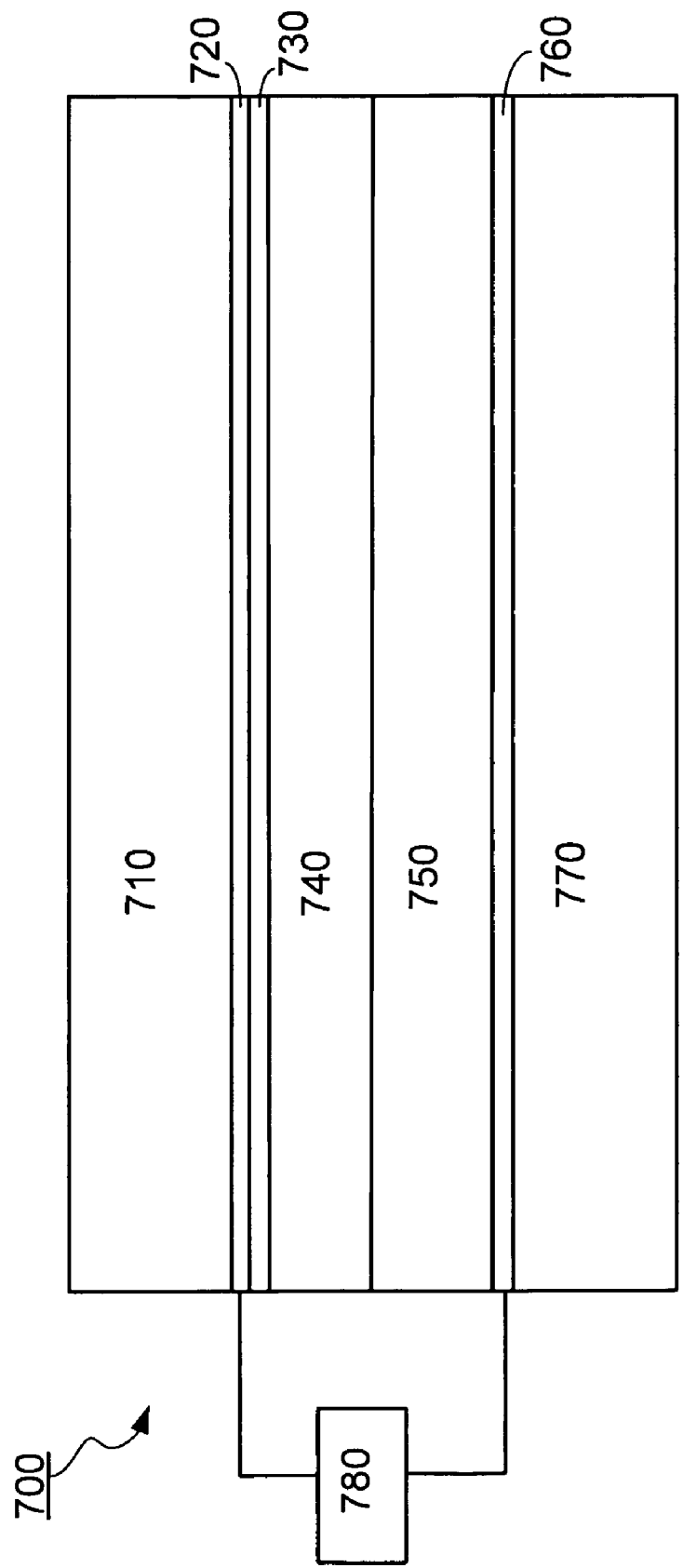
FIG. 9 is a cross-sectional view of a dye sensitized solar cell.

In some embodiments, the stamping methods described above can be used to print an electrode on a substrate for use in a DSSC. FIG. 9 is a cross-sectional view of DSSC 700 that includes a substrate 710, an electrode 720, a catalyst layer 730, a charge carrier layer 740, a photoactive layer 750, an electrode 760, a substrate 770, and an external load 780. Examples of DSSCs are discussed in U.S. patent application Ser. Nos. 11/311,805 filed Dec. 19, 2005 and Ser. No. 11/269,956 filed on Nov. 9, 2005, the contents of which are hereby incorporated by reference.

In some embodiments, the stamping methods described above can be used to print an electrode on a substrate for use in a tandem cell. Examples of tandem photovoltaic cells are discussed in U.S. patent application Ser. No. 10/558,878 and U.S. Provisional Application Ser. Nos. 60/790,606, 60/792, 635, 60/792,485, 60/793,442, 60/795,103, 60/797,881, and 60/798,258, the contents of which are hereby incorporated by reference.

While certain embodiments have been disclosed, other embodiments are also possible.

As one example, while cathodes formed of mesh have been described, in some embodiments a mesh anode can be used. This can be desirable, for example, when light transmitted by the anode is used. In certain embodiments, both a mesh cathode and a mesh anode are used. This can be desirable, for example, when light transmitted by both the cathode and the anode is used.

As another example, while embodiments have generally been described in which light that is transmitted via the cathode side of the cell is used, in certain embodiments light transmitted by the anode side of the cell is used (e.g., when a mesh anode is used). In some embodiments, light transmitted by both the cathode and anode sides of the cell is used (when a mesh cathode and a mesh anode are used).

As a further example, while electrodes (e.g., mesh electrodes, non-mesh electrodes) have been described as being formed of electrically conductive materials, in some embodiments a photovoltaic cell may include one or more electrodes (e.g., one or more mesh electrodes, one or more non-mesh electrodes) formed of a semiconductive material. Examples of semiconductive materials include indium tin oxide, fluorinated tin oxide, tin oxide, and zinc oxide.

As an additional example, in some embodiments, one or more semiconductive materials can be disposed in the open regions of a mesh electrode (e.g., in the open regions of a mesh cathode, in the open regions of a mesh anode, in the open regions of a mesh cathode and the open regions of a mesh anode). Examples of semiconductive materials include tin oxide, fluorinated tin oxide, tin oxide and zinc oxide. Other semiconductive materials, such as partially transparent semiconductive polymers, can also be disposed in the open regions of a mesh electrode. For example, a partially transparent polymer can be a polymer which, at the thickness used in a photovoltaic cell, transmits at least about 60% (e.g., at least about 70%, at least about 75%, at least about 80%, at least about 85%, at least about 90%, at least about 95%) of incident light at a wavelength or a range of wavelengths used during operation of the photovoltaic cell. Typically, the semiconductive material disposed in an open region of a mesh electrode is transparent at the thickness used in the photovoltaic cell.

As another example, in certain embodiments, a protective layer can be applied to one or both of the substrates. A protective layer can be used to, for example, keep contaminants (e.g., dirt, water, oxygen, chemicals) out of a photovoltaic cell and/or to ruggedize the cell. In certain embodiments, a protective layer can be formed of a polymer (e.g., a fluorinated polymer).

As a further example, while certain types of photovoltaic cells have been described that have one or more mesh electrodes, one or more mesh electrodes (mesh cathode, mesh anode, mesh cathode and mesh anode) can be used in other types of photovoltaic cells as well. Examples of such photovoltaic cells include photoactive cells with an active material formed of amorphous silicon, cadmium selenide, cadmium telluride, copper indium sulfide, and copper indium gallium arsenide.

As an additional example, while described as being formed of different materials, in some embodiments materials 302 and 304 are formed of the same material.

As another example, although shown in FIG. 5 as being formed of one material coated on a different material, in some embodiments solid regions 222 can be formed of more than two coated materials (e.g., three coated materials, four coated materials, five coated materials, six coated materials).

Other embodiments are in the claims.

What is claimed is:

1. A method, comprising:
   providing a die having a first surface with a mesh pattern formed therein;
   providing a first article comprising a metal layer supported by a surface of a first layer, the metal layer being in a first form;
   providing a second article comprising a photoactive material supported by a second layer different from the first layer;
   disposing the first article between the second article and the die; and while the first article is between the second article and the die, contacting the first surface of the die with the surface of the first layer so that the metal layer changes from the first form to a second form different from the first form, the second form of the metal layer being a metal mesh, thereby forming a third article comprising the metal mesh and the photoactive material.

2. The method of claim 1, wherein the die is at least about 100° C. when the surface of the die contacts the first layer.

3. The method of claim 1, wherein the die is at least about 300° C. when the surface of the die contacts the first layer.

4. The method of claim 1, further comprising applying a pressure of at least about 100 psi to the die when the surface of the die contacts the first layer.

5. The method of claim 1, further comprising applying a pressure of at least about 1,000 psi to the die when the surface of the die contacts the first layer.

6. The method of claim 1, further comprising applying a pressure of at least about 5,000 psi to the die when the surface of the die contacts the first layer.

7. The method of claim 1, wherein, prior to disposing the first article between the second article and the die, a release layer is between the metal layer and the first layer.

8. The method of claim 7, wherein the release layer comprises polyesters or polyethylenes.

9. The method of claim 1, wherein the metal layer comprises aluminum, iron, gold, silver, copper, nickel, palladium, platinum, titanium, or an alloy thereof 10. The method of claim 1, wherein the metal mesh comprises a plurality of open regions, at least some of the open regions have a rectangular, square, circular, semicircular, triangular, diamond, ellipse, trapezoid, or irregular shape.

11. The method of claim 1, wherein the metal mesh comprises a plurality of open regions, at least some of the open regions have a waved, sloped, arched, pointed, striped, or checkered shape.

12. The method of claim 1, wherein the third article comprises a third layer, and the third layer is a substrate.

13. The method of claim 1, wherein the third article comprises a photovoltaic cell comprising a photoactive material between a substrate and the metal mesh.

14. The method of claim 13, wherein the photoactive material comprises an electron donor material and an electron acceptor material.

15. The method of claim 14, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups and combinations thereof.

16. The method of claim 14, wherein the electron donor material comprises a material selected from the group consisting of discotic liquid crystals, polythiophenes, polyphenylenes, polyphenylvinylenes, polysilanes, polythienylvinylenes and polyisothianaphthalenes.

17. The method of claim 13, wherein the photoactive material comprises a photosensitized interconnected nanoparticle material.

18. The method of claim 17, wherein the photosensitized interconnected nanoparticle material comprises a material selected from the group consisting of selenides, sulfides, tellurides, titanium oxides, tungsten oxides, zinc oxides, zirconium oxides, and combinations thereof.

19. The method of claim 13, wherein the photovoltaic cell comprises a hole carrier layer between the metal mesh and the photoactive material.

20. The method of claim 13, wherein the photovoltaic cell comprises a hole blocking layer between the metal mesh and the photoactive material.

21. The method of claim 1, wherein at least a portion of the surface of the die is planar or curved.

22. The method of claim 1, wherein the first and/or the second layer comprises a flexible substrate.

23. The method of claim 1, wherein the first and/or second layer comprises a polymer selected from the group consisting of polyethylene terephthalates, polyimides, polyethylene naphthalates, polymeric hydrocarbons, cellulosic polymers, polycarbonates, polyamides, polyethers, polyether ketones, and combinations thereof.

24. The method of claim 1, wherein:
the first layer comprises first and second surfaces;
the die contacts the first surface of the first layer; and
prior to contact between the die and the first layer, the metal layer is supported on the second surface of the first layer.

25. The method of claim 24, wherein, prior to contact between the die and the first layer, the metal layer is a continuous layer without openings therein.

26. The method of claim 1, wherein the third article is selected from the group consisting of liquid crystal displays, light emitting diodes, and photovoltaic cells.

27. The method of claim 1, wherein the third article comprises a photovoltaic cell.

28. The method of claim 27, wherein the photovoltaic cell is in a photovoltaic module.

29. The method of claim 1, wherein the third article is further processed to form a fourth article selected from the group consisting of liquid crystal displays, light emitting diodes, and photovoltaic cells.

30. The method of claim 1, wherein the third article is further processed to form a fourth article comprising a photovoltaic cell.

31. The method of claim 30, wherein the photovoltaic cell is in a photovoltaic module.

32. A method, comprising:
providing a first article comprising a metal layer without openings therein, the metal layer being supported by a first surface of a first layer, the first layer having a second surface opposite the first surface;
providing a second article comprising a photoactive layer supported by a second layer different from the first layer;
disposing the first article between the second article and a die, the die having a surface with a mesh pattern formed therein; and
while the first article is between the second article and the die, contacting the second surface of the first layer with the surface of the die so that the metal layer is formed into a metal mesh, thereby forming a third article that comprises the second layer, the photoactive material and the metal mesh.

33. The method of claim 32, wherein the third article comprises a photovoltaic cell.

34. The method of claim 33, wherein the first layer is a first substrate of the photovoltaic cell, and the second layer is a second substrate of the photovoltaic cell.

35. The method of claim 32, wherein the photovoltaic cell further comprises a hole carrier layer between the mesh electrode and the photoactive material.

36. The method of claim 35, wherein the photovoltaic cell further comprises a hole blocking layer between the photoactive material and the second layer.

37. The method of claim 32, wherein the photovoltaic cell further comprises a hole blocking layer between the mesh electrode and the photoactive material.

38. The method of claim 37, wherein the photovoltaic cell further comprises a hole carrier layer between the photoactive material and the second layer.

39. The method of claim 32, further comprising releasing the metal mesh from the first layer.

40. The method of claim 39, further comprising, after releasing the metal mesh from the first layer, applying a third layer to the metal mesh to provide the second article.

41. The method of claim 40, wherein the second article comprises a photovoltaic cell.

42. The method of claim 41, wherein the third layer is a first substrate of the photovoltaic cell, and the second layer is a second substrate of the photovoltaic cell.

43. The method of claim 42, wherein the photovoltaic cell further comprises a hole blocking layer between the photoactive material and the second layer.

44. The method of claim 41, wherein the photovoltaic cell further comprises a hole carrier layer between the mesh electrode and the photoactive material.

45. The method of claim 41, wherein the photovoltaic cell further comprises a hole blocking layer between the mesh electrode and the photoactive material.

46. The method of claim 45, wherein the photovoltaic cell further comprises a hole carrier layer between the photoactive material and the second layer.

* * * * *

UNITED STATES PATENT AND TRADEMARK OFFICE
CERTIFICATE OF CORRECTION

PATENT NO. : 7,749,794 B2  Page 1 of 1
APPLICATION NO. : 11/473467
DATED : July 6, 2010
INVENTOR(S) : Russell Gaudiana, Alan Montello and Edmund Montello It is certified that error appears in the above-identified patent and that said Letters Patent is hereby corrected as shown below:

Column 11, Line 28 (approx.)
Delete "thereof," insert -- thereof. --

Signed and Sealed this

Twenty-eighth Day of September, 2010

David J. Kappos
Director of the United States Patent and Trademark Office